United States Patent [19]
Sbuelz et al.

[11] 4,297,649
[45] Oct. 27, 1981

[54] MALFUNCTION DETECTOR FOR A GROUP OF CYCLICALLY INTERCONNECTED PHASE-LOCKED OSCILLATORS

[75] Inventors: Anes Sbuelz; Francesco Marchelli, both of Milan, Italy

[73] Assignee: Societa Italiana Telecomunicazioni Siemens S.p.A., Milan, Italy

[21] Appl. No.: 53,280

[22] Filed: Jun. 29, 1979

[30] Foreign Application Priority Data

Jul. 3, 1978 [IT] Italy .............................. 25268 A/78

[51] Int. Cl.³ .............................................. H03L 7/00
[52] U.S. Cl. ........................................ 331/2; 331/49; 331/55
[58] Field of Search .................... 331/46, 49, 50, 55, 331/56, 2

[56] References Cited

U.S. PATENT DOCUMENTS 3,369,190  2/1968  Pope ..................................... 331/55
3,662,277  5/1972  White ................................. 331/49 X

*Primary Examiner*—Siegfried H. Grimm
*Assistant Examiner*—Edward P. Westin
*Attorney, Agent, or Firm*—Karl F. Ross

[57] ABSTRACT

Three or more oscillators to be locked in phase with one another are interconnected in a closed ring and have individual feedback loops including respective frequency dividers designed to keep them in step with a synchronizing frequency, equal to a fraction of their own operating frequency, fed in through an associated multiplexer. The multiplexer has a first input receiving the stepped-down feedback frequency of the immediately preceding oscillator, a second input connected to the output of the associated frequency divider, and a third input energizable with an external reference frequency such as a carrier of a PCM of FDM system. Each multiplexer, in the absence of an external switching command which holds it on its third input, stands on its first input unless a control circuit associated with the immediately preceding oscillator detects a disparity between the two frequencies fed to that preceding oscillator via the feedback loop and the multiplexer of the latter. In the event of such a disparity, indicating a malfunction of the oscillator associated with the control circuit detecting same, the multiplexer associated with the next-following oscillator is switched onto its second input to transform the phase-locking ring into an open-ended cascade, with emission of an alarm signal identifying the defective oscillator. Each frequency divider is provided with a self-checking circuit emitting a different alarm signal in the event of a malfunction thereof.

5 Claims, 3 Drawing Figures

MALFUNCTION DETECTOR FOR A GROUP OF CYCLICALLY INTERCONNECTED PHASE-LOCKED OSCILLATORS

FIELD OF THE INVENTION

Our present invention relates to a malfunction detector for a group of phase-locked oscillators designed to generate a number of oscillations, e.g. square waves, that are harmonically related to a common reference frequency.

BACKGROUND OF THE INVENTION

The maintenance of proper phase correlation among such oscillators, particularly in a communication system, is important for the purpose of avoiding loss of information, cross-talk, desynchronization and interruption of service.

In principle, the several oscillators could be kept in step either by a common external reference oscillation applied to their synchronizing inputs or by a cyclical connection in which the output signal of any oscillator serves as a synchronizing signal for the immediately following oscillator. In the first instance, a control circuit associated with each oscillator detects frequency or phase disparities between the generated oscillations and the reference wave and, if these disparities exceed a certain limit, causes the automatic replacement of the faulty oscillator by a properly operating one. In the second instance, a fault occurring in one oscillator also affects the next-following oscillator which may then be needlessly eliminated from the chain.

OBJECTS OF THE INVENTION

An important object of our present invention, therefore, is to provide means in an oscillation-generating circuit arrangement of the last-mentioned type for obviating unnecessary exclusions of properly operating oscillators and for positively identifying, for replacement, any actually malfunctioning ocillator.

Another object, related to the preceding one, is to provide means for discriminating between a defective oscillator and a malfunctioning frequency divider associated with such an oscillator.

SUMMARY OF THE INVENTION

In accordance with our present invention, a circuit arrangement for maintaining three or more oscillators of the phase-controlled type locked in phase with one another comprises a multiplicity of cyclically interconnected generator stages each comprising an oscillator, a multiplexer and a control circuit. The oscillator has a synchronizing input connected to the multiplexer output and has another input connected to its own output by a feedback loop usually including a frequency divider allowing its own operating frequency to be a multiple of a synchronizing frequency received through the multiplexer. The latter has a first input connected to the output of the oscillator of the immediately preceding stage and a second input connected to the feedback loop of the oscillator. The control circuit has two inputs connected in parallel with those of the oscillator to the feedback loop and to the multiplexer output, respectively, and responds to a disparity in frequency or phase between the feedback and synchronizing oscillations appearing on these two inputs by switching the multiplexer of the immediately succeeding stage to the second input thereof with concurrent emission of an alarm signal indicative of a malfunction of its own oscillator. The switchover of the multiplexer of the next-following stage causes the latter to operate independently of the output signal of the faulty oscillator and to keep the remaining oscillators down the line in step.

Advantageously, pursuant to another feature of our invention, the multiplexer further has a third input connected to a source of an external reference oscillation to which the multiplexer is switchable in response to an external command generated in the presence of the reference oscillation; the latter may be, for example, a carrier of a PCM (Pulse-Code Modulation) or FDM (Frequency-Division Multiplexing) communication system. When the reference oscillation disappears for any reason, the external switching command is automatically discontinued so that the multiplexers no longer receiving this command return to their first position giving passage to the output signals of the respectively preceding stages.

According to still another feature of our invention, the frequency divider stepping down the operating frequency of any oscillator along its feedback loop is provided with an internal checking circuit emitting a distinctive alarm signal indicative of a malfunction inherent in the divider itself and independent of the associated oscillators. Such an alarm signal, therefore, may allow the automatic substitution of a standby divider for the defective one without removing the associated oscillator itself.

BRIEF DESCRIPTION OF THE DRAWING

The above and other features of our invention will now be described in detail with reference to the accompanying drawing in which.

SPECIFIC DESCRIPTION

Figure 1:
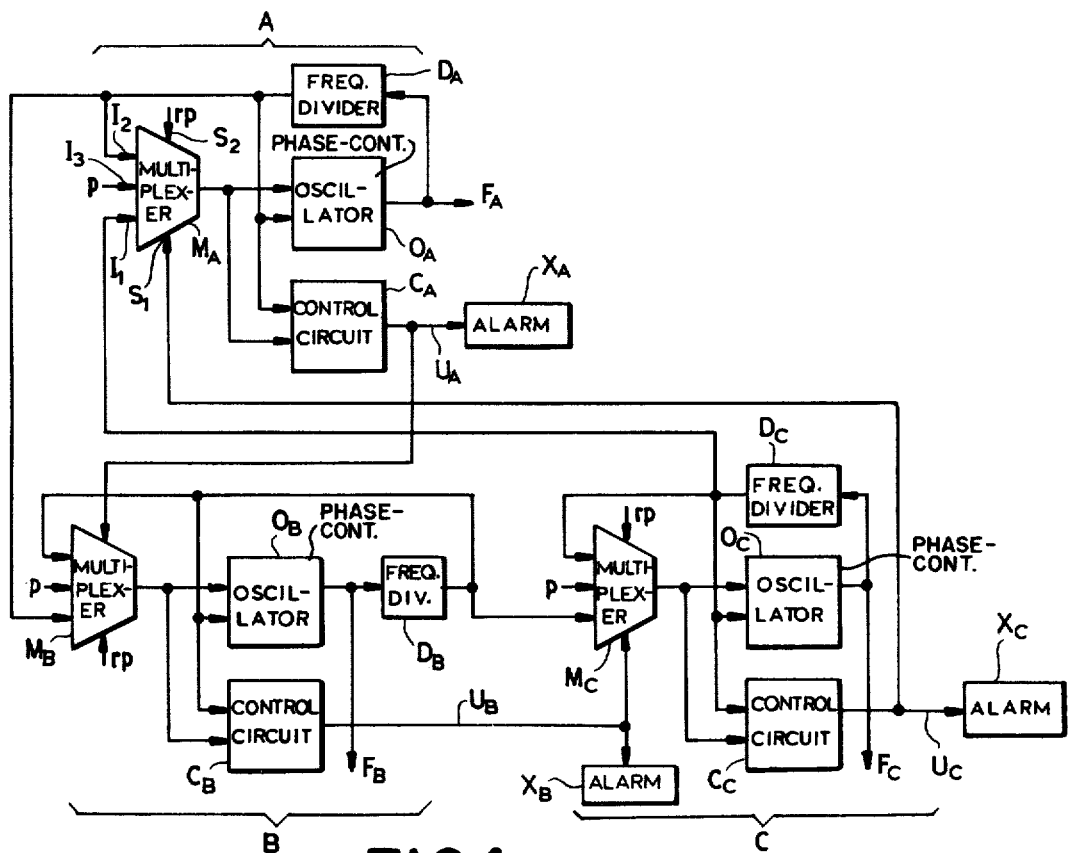
FIG. 1 is a block diagram of a three-stage oscillation generator according to our invention.

In FIG. 1 we have shown a circuit arrangement comprising three cyclically interconnected stages A, B and C. Stage A includes an oscillator $O_A$, a multiplexer $M_A$, a control circuit $C_A$ and a frequency divider $D_A$ inserted in a feedback loop between the oscillator output $F_A$ and one input each of the oscillator $O_A$ and circuit $C_A$. Another input of each of these components is connected to the output of multiplexer $M_A$ which has three inputs $I_1$, $I_2$ and $I_3$. Each oscillator is of the phase-controlled type and is therefore provided with a phase comparator as is well known in the art.

Corresponding elements of the other two stages, which are structurally identical with stage A, are oscillators $O_B$, $O_C$, multiplexers $M_B$, $M_C$, control circuits $C_B$, $C_C$ and frequency dividers $D_B$, $D_C$. Each control circuit $C_A$, $C_B$, $C_C$ has a normally de-energized output $U_A$, $U_B$, $U_C$ which extends to a respective alarm circuit $X_A$, $X_B$, $X_C$. The first input $I_1$ of multiplexer $M_A$ is tied to the output of the frequency divider $D_C$ of the immediately preceding stage C, being thus connected in parallel with one input each of oscillator $O_C$ and control circuit $C_C$ of that preceding stage. The second input $I_2$ of multiplexer $M_A$ is tied to the output of its own frequency divider $D_A$ and is thus connected in parallel with respective inputs of the associated oscillator $O_A$ and control circuit $C_A$. Its third input $I_3$ is connected to a source of an external reference oscillation p, in the shape of a square wave or a pulse train, in parallel with the corresponding inputs of the other multiplexers $M_B$, $M_C$. A first switching input $S_1$ of multiplexer $M_A$ is connected to the output $U_C$ of the control circuit $C_C$ of the immediately preceding stage C, while a second switching input $S_2$ receives an external command rp derived from reference oscillation p in the presence of the latter.

Analogous connections interlink corresponding inputs of the other multiplexers with the divider outputs of their own and of the immediately preceding stages.

In the presence of switching command rp, all the multiplexers stand on their third inputs whereby each oscillator is synchronized by reference oscillation p. If any oscillator falls out of step on account of a malfunction, the associated control circuit recognizes the disparity between the frequencies reaching its input and activates the corresponding alarm device for automatic or possibly manual replacement of that oscillator by a standby component. This has no effect upon any other oscillator in the chain.

If, however, reference oscillation p and the command rp disappear, the multiplexers are automatically shifted to their first inputs on which they receive the output frequencies of the oscillators of the immediately preceding stages, as stepped down by the corresponding voltage dividers. In normal operation, the several oscillators then operate at frequencies which are the mean of their natural frequencies as established by the respective feedback loops; these natural frequencies, of course, should be as close as possible to one another.

If any one of the cyclically interlinked oscillators malfunctions, its control circuit switches the multiplexer of the next-following stage to its second input whereby the oscillator of that stage is synchronized by its own stepped-down operating frequency independently of the malfunction occurring in the preceding stage. Thus, for example, if oscillator $O_B$ goes faulty, control circuits $C_B$ and $C_C$ will at first respond, yet the output signal from circuit $C_B$ immediately switches multiplexer $M_C$ to its second input tied to the output of frequency divider $D_C$, whereby control circuit $C_C$ sees identical input frequencies and returns multiplexer $M_A$ to its first input $I_1$. Thus, pending the curing of the defect of oscillator $O_B$ or its replacement by a properly operating standby unit, stages C and A operate in an open-ended cascade with stage C acting as the master. If oscillator $C_C$, for example, should also develop a malfunction at this point, multiplexer $M_A$ would be switched onto its second input $I_2$ so that stage A will continue to operate normally.

It will be evident that the mode of operation just described also applies to a circuit arrangement with a larger number of stages cyclically interconnected in the manner shown for stages A, B and C.

Figure 2:
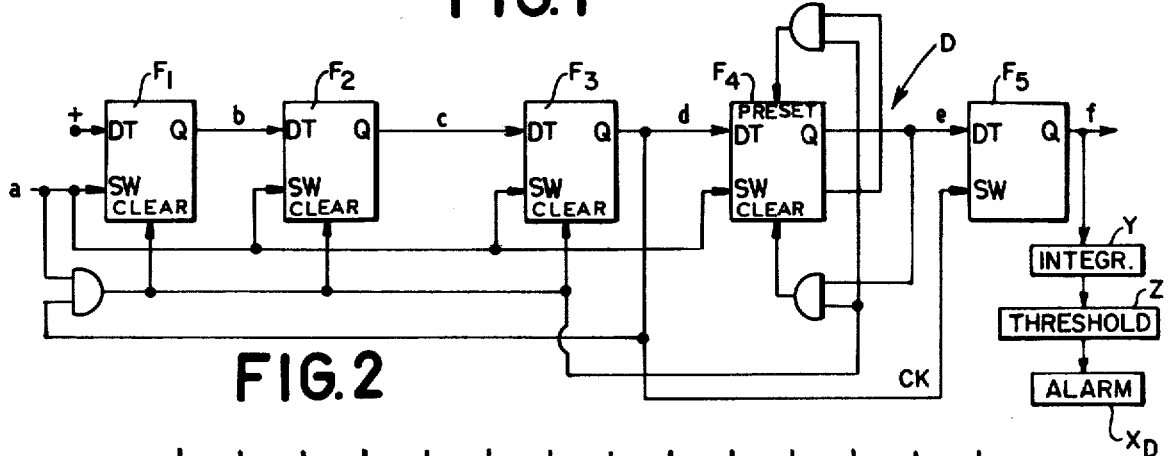
FIG. 2 is a more detailed diagram of a frequency divider representative of any of several such dividers shown in FIG. 1.
Figure 3:
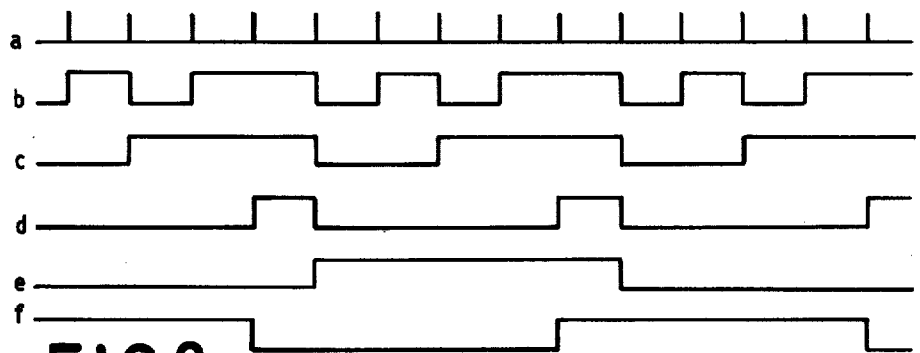
FIG. 3 is a set of graphs relating to the operation of the frequency divider of FIG. 2.

In FIG. 2 we have illustrated a frequency divider D which is representative of any one of dividers $D_A$, $D_B$ and $D_C$ shown in FIG. 1. This divider comprises four cascaded flip-flops $F_1$, $F_2$, $F_3$ and $F_4$ constituting a conventional binary counter. Flip-flop $F_1$ is switched by a pulse train a, derived from the output frequency of the corresponding oscillator, which has been illustrated in the top graph of FIG. 3. The next four graphs show the output signals b,c,d and e of the four flip-flops $F_1$–$F_4$. A clock signal CK derived from the output lead d of flip-flop $F_3$, forming part of the internal circuitry of the frequency divider D, is applied to the switching input of a further flip-flop $F_5$ of JK type whose data input receives the output signal e of flip-flop $F_4$ and which normally has an output signal f shown in the bottom graph of FIG. 3. If a malfunction occurs anywhere in the cascade of the flip-flops $F_1$–$F_5$, signal f changes from a square wave to a continuous level of logical value "0" or "1", which is detected by an internal checking circuit including an integrator Y and a threshold circuit Z connected in series to the output of flip-flop $F_5$. Such detection triggers an individual alarm $X_D$ indicating the malfunction of the frequency divider concerned. Data inputs, switching inputs and outputs of flip-flops $F_1$–$F_5$ have been respectively designated DT, SW and Q in FIG. 2.

We claim:

1. A circuit arrangement for generating a multiplicity of oscillations locked in phase with one another, comprising a multiplicity of cyclically interconnected generator stages each comprising:
   a phase-controlled oscillator with a synchronizing input and with a feedback loop between an output and another input thereof;
   a multiplexer with a first input connected to the output of the oscillator of the immediately preceding stage, a second input connected to said feedback loop and an output connected to said synchronizing input; and
   a control circuit with inputs connected in parallel with those of said oscillator to said feedback loop and to the output of said multiplexer, respectively, said control circuit being responsive to a disparity between the frequencies of feedback and synchronizing oscillations appearing on its said inputs for switching only the multiplexer of the immediately succeeding stage to said second input thereof with concurrent emission of an alarm signal indicative of a malfunction of the associated oscillator.

2. A circuit arrangement as defined in claim 1 wherein said multiplexer is further provided with a third input connected to a source of an external reference oscillation, said multiplexer being switchable onto said third input in response to an external command generated in the presence of said reference oscillation.

3. A circuit arrangement as defined in claim 1 or 2 wherein said feedback loop includes a frequency divider.

4. A circuit arrangement as defined in claim 3 wherein said frequency divider is provided with an internal checking circuit for emitting a distinctive alarm signal indicative of a malfunction inherent in said frequency divider.

5. A circuit arrangement as defined in claim 4 wherein said frequency divider comprises a plurality of cascaded flip-flops, said checking circuit comprising a further flip-flop with a data input connected to an output of the last one of said cascaded flip-flops and with a switching input connected to an output of another of said cascaded flip-flops.

* * * * *